(12) United States Patent
Nishimura et al.

(10) Patent No.: US 8,778,206 B2
(45) Date of Patent: Jul. 15, 2014

(54) SUBSTRATE PROCESSING METHOD AND STORAGE MEDIUM

(75) Inventors: Eiichi Nishimura, Miyagi (JP); Takashi Sone, Miyagi (JP); Fumiko Yamashita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 123 days.

(21) Appl. No.: 13/400,247

(22) Filed: Feb. 20, 2012

(65) Prior Publication Data

US 2012/0214315 A1  Aug. 23, 2012

Related U.S. Application Data

(60) Provisional application No. 61/449,919, filed on Mar. 7, 2011.

(30) Foreign Application Priority Data

Feb. 21, 2011  (JP) ................................ 2011-034568

(51) Int. Cl.
  *B44C 1/22*  (2006.01)
  *H01L 21/3065*  (2006.01)

(52) U.S. Cl.
  USPC ............... 216/67; 216/79; 438/710; 438/719; 134/1.1

(58) Field of Classification Search
  USPC ................. 216/67, 79; 438/710, 719; 134/1.1
  See application file for complete search history.

(56) References Cited

U.S. PATENT DOCUMENTS

| 6,372,655 | B2 * | 4/2002 | Khan et al. | 438/714 |
| 6,635,185 | B2 * | 10/2003 | Demmin et al. | 216/64 |
| 6,846,746 | B2 * | 1/2005 | Rattner et al. | 438/706 |
| 2007/0231992 | A1 * | 10/2007 | Balasubramaniam | 438/227 |
| 2010/0068885 | A1 * | 3/2010 | Cirigliano et al. | 438/703 |
| 2010/0200412 | A1 * | 8/2010 | Reid et al. | 205/123 |

FOREIGN PATENT DOCUMENTS

JP  2010-153702 A  7/2010

\* cited by examiner

*Primary Examiner* — Shamim Ahmed
(74) *Attorney, Agent, or Firm* — Pearne & Gordon LLP

(57) ABSTRACT

In a substrate processing method, a polysilicon layer 38 on a wafer W is etched with a bromine cation 45a and a bromine radical 45b in plasma generated from a processing gas containing a hydrogen bromide gas, an oxygen gas, and a nitrogen trifluoride gas, and then, is ashed with an oxygen radical 46 and a nitrogen radical 47 in plasma generated from a processing gas containing an oxygen gas and a nitrogen gas. Thereafter, the polysilicon layer 38 is etched with a fluorine cation 48a and a fluorine radical 48b in plasma generated from a processing gas containing an argon gas and a nitrogen trifluoride gas. While the polysilicon layer 38 is ashed, an oxidation process is performed on a silicon bromide generated by etching the polysilicon layer 38 with the bromine cation 45a.

10 Claims, 5 Drawing Sheets

SUBSTRATE PROCESSING METHOD AND STORAGE MEDIUM

CROSS-REFERENCE TO RELATED APPLICATION

This application claims the benefit of Japanese Patent Application No. 2011-034568 filed on Feb. 21, 2011, and U.S. Provisional Application Ser. No. 61/449,919 on Mar. 7, 2011, the entire disclosures of which are incorporated herein by reference.

FIELD OF THE INVENTION

The present disclosure relates to a substrate processing method and a storage medium.

BACKGROUND OF THE INVENTION

In a DRAM as a semiconductor device, a capacitor is formed in a cylinder shape in order to obtain capacitance of the capacitor. However, recently, it has been considered to form a capacitor in a polysilicon layer. In this case, it is necessary to form a hole of a high aspect ratio in the polysilicon layer formed on a semiconductor wafer (hereinafter, simply referred to as "wafer").

Typically, a polysilicon layer is etched by using plasma generated from a halogen-based gas such as a hydrogen bromide (HBr) gas. If a hole of a high aspect ratio is formed in the polysilicon layer, a deposit generated by etching is formed on a hard mask layer having a pattern in order to prevent the hard mask from being etched. Thus, etching selectivity of the polysilicon layer can be relatively increased. This method has been suggested by the present applicant (see, for example, Patent Document 1).

Patent Document 1: Japanese Patent Laid-open Publication No. 2010-153702

However, as depicted in FIG. 5(a), if a polysilicon layer 50 is etched by using plasma generated from a hydrogen bromide gas, a bromine radical 51 in the plasma reacts with silicon so as to produce a reactive product such as silicon bromide (SiBrx (x is a natural number)). Further, the reactive product produced by the etching includes silicon oxybromide (SiOBrx (x is a natural number)). Since, however, the etching is typically performed in a depressurized environment where an atmosphere does not exist. Thus, the generated reactive product is silicon bromide or the like without oxygen.

The generated silicon bromide is deposited on an inner surface of the hole 52 as a deposit 53 (FIG. 5(b)). As the polysilicon layer 50 is etched, the amount of the silicon bromide is increased. Since it is difficult to remove the silicon bromide by using bromine plasma or hydrogen plasma, the amount of the deposit 53 formed on the inner surface of the hole 52 is increased, and silicon is hardly exposed at the hole 52 (FIG. 5(c)). Thus, an etching rate of the polysilicon layer 50 is decreased.

BRIEF SUMMARY OF THE INVENTION

Illustrative embodiments provide a substrate processing method for forming a hole of a high aspect ratio in a silicon layer without decreasing an etching rate and further provide a storage medium.

In accordance with one aspect of an illustrative embodiment, there is provided a substrate processing method performed in a substrate processing apparatus including a processing chamber that accommodates therein a wafer. The substrate processing method includes a main etching process for etching a silicon layer formed on the wafer with plasma generated from a processing gas containing bromine; an ashing process for ashing the etched silicon layer with plasma generated from a processing gas containing oxygen; and a break-through etching process for etching the asked silicon layer with plasma generated from a processing gas containing fluorine. The ashing process may include an oxidation process for oxidizing a reactive product generated in the main etching process.

The main etching process, the ashing process, and the break-through etching process may be performed in this sequence and repeated twice or more.

The substrate processing method may further include, prior to the main etching process, a preliminary etching process for etching the silicon layer with plasma generated from a processing gas containing bromine and a processing gas containing fluorine.

The processing gas containing oxygen may contain a nitrogen gas.

A processing time ratio between the main etching process, the ashing process, and the break-through etching process may be from about 42 to about 48: from about 1 to about 2: from about 2 to about 3.

In the break-through etching process, two electric powers having a higher frequency and a lower frequency may be used in the substrate processing apparatus, and the lower frequency may be less than about 13.52 MHz.

Desirably, the lower frequency may be less than about 3 MHz.

An internal pressure of the processing chamber may be controlled to be substantially constant during the main etching process, the ashing process, and the break-through etching process.

Each of output values of two high frequency powers used in the substrate processing apparatus may be controlled to be substantially constant during the main etching process, the ashing process, and the break-through etching process.

A total flow rate of each of the processing gases supplied to the processing chamber may be controlled to be substantially constant during the main etching process, the ashing process, and the break-through etching process.

In accordance with another aspect of an illustrative embodiment, there is provided a computer-readable storage medium having stored thereon computer-readable instructions that, in response to execution, cause a substrate processing apparatus including a processing chamber that accommodates therein a wafer to perform a substrate processing method for carrying out a process on the wafer. The substrate processing method includes a main etching process for etching a silicon layer formed on the wafer with plasma generated from a processing gas containing bromine; an ashing process for ashing the etched silicon layer with plasma generated from a processing gas containing oxygen; and a break-through etching process for etching the asked silicon layer with plasma generated from a processing gas containing fluorine. The ashing process may include an oxidation process for oxidizing a reactive product generated in the main etching process.

In the storage medium, the main etching process, the ashing process, and the break-through etching process may be performed in this sequence and repeated twice or more.

In the storage medium, the substrate processing method may further include, prior to the main etching process, a preliminary etching process for etching the silicon layer with plasma generated from a processing gas containing bromine and a processing gas containing fluorine.

In accordance with illustrative embodiments, a silicon layer formed on a wafer is etched with plasma generated from a processing gas containing bromide, asked with plasma generated from a processing gas containing oxygen, and etched with plasma generated from a processing gas containing fluorine. An oxidation process is performed to a reactive product generated by etching the silicon layer with bromide plasma during the ashing process. Since the reactive product generated by etching the silicon layer with bromide plasma is difficult to be removed with bromide plasma, the reactive product is oxidized with oxygen radicals. Here, the oxygen radicals are generated from the ashing process and changed into an oxide. The oxide can be easily removed by etching with fluorine plasma. That is, it is easy to remove the reactive product by changing the reactive product into the oxide. Therefore, it is possible to remove a deposit formed of the reactive product deposited on an inner surface of a hole, and, thus, the hole of a high aspect ratio can be formed in the silicon layer without decreasing an etching rate.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, illustrative embodiments will be described with reference to the accompanying drawings.

Figure 1:
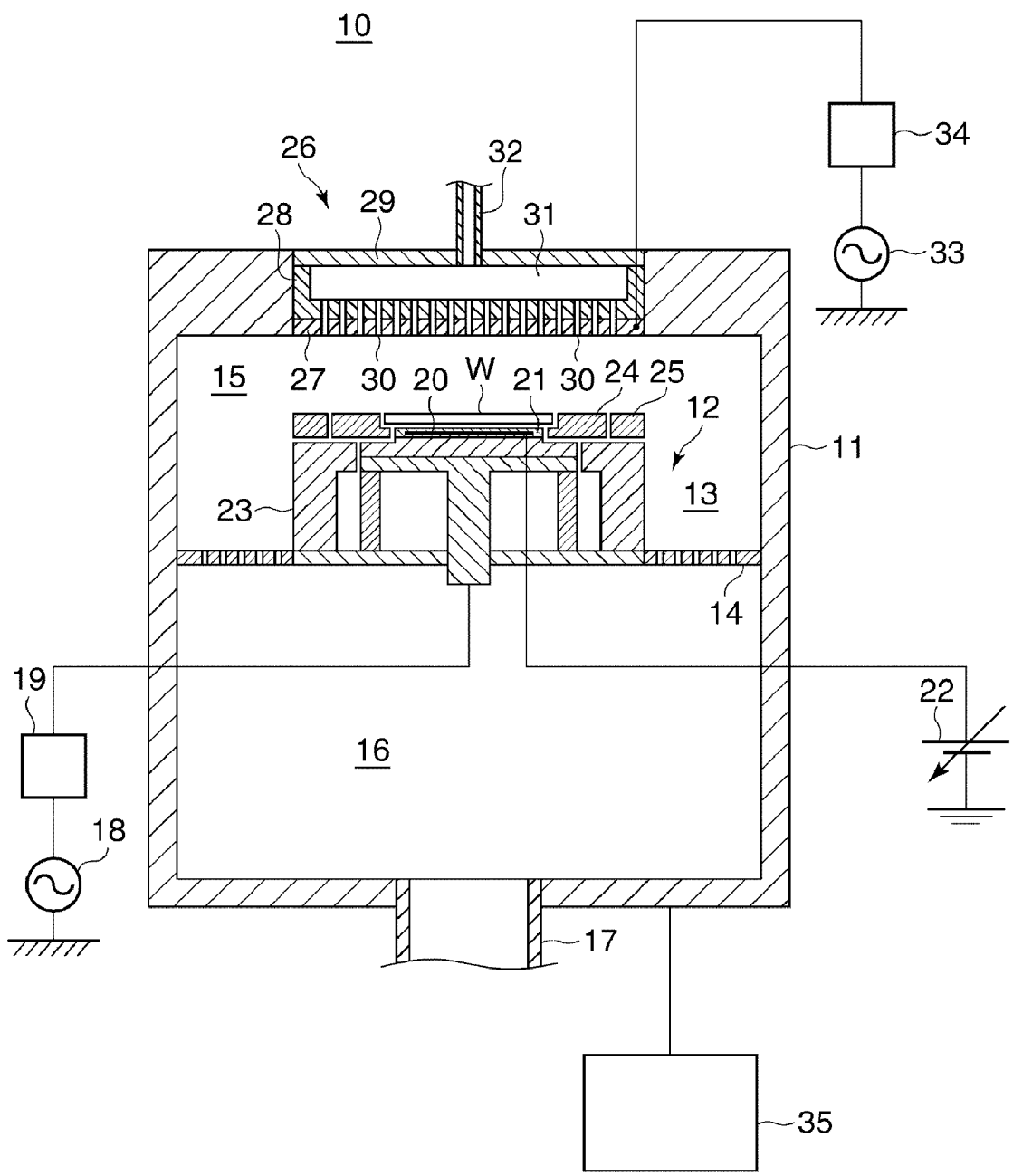
FIG. 1 is a schematic configuration view of a substrate processing apparatus for performing a substrate processing method in accordance with an illustrative embodiment.

FIG. 1 is a schematic configuration view of a substrate processing apparatus for performing a substrate processing method in accordance with an illustrative embodiment. In the substrate processing apparatus, a plasma etching process is performed on a semiconductor device wafer (hereinafter, simply referred to as "wafer") as a substrate.

In FIG. 1, a substrate processing apparatus 10 includes a chamber 11 for accommodating therein a wafer W having a diameter of, e.g., about 300 mm, and a circular column-shaped susceptor 12 for mounting thereon the wafer W is provided within the chamber 11. In the substrate processing apparatus 10, a side exhaust path 13 is formed between an inner sidewall of the chamber 11 and a side surface of the susceptor 12. An exhaust plate 14 is provided at a certain portion of the side exhaust path 13.

The exhaust plate 14 is a plate-shaped member having a multiple number of through holes, and the exhaust plate 14 serves as a partition plate that divides the chamber 11 into an upper part and a lower part. As will be described later, plasma is generated in an inner space of the upper part 15 (hereinafter, referred to as "processing chamber") of the chamber 11. Further, an exhaust pipe 17 for exhausting a gas within the chamber 11 is connected to the lower part 16 (hereinafter, referred to as "exhaust room (manifold)") of the chamber 11. The exhaust plate 14 confines or reflects the plasma generated within the processing chamber 15 so as to prevent leakage of the plasma into the manifold 16.

A TMP (Turbo Molecular Pump) and a DP (Dry Pump) (both not shown) are connected to the exhaust pipe 17, and these pumps evacuate and depressurize the inside of the chamber 11. To be specific, the DP depressurizes the inside of the chamber 11 to an intermediate vacuum state (for example, about $1.3 \times 10$ Pa (about 0.1 Torr) or less) from an atmospheric pressure. Further, in cooperation with the DP, the TMP further depressurizes the inside of the chamber 11 to a high vacuum state (e.g., about $1.3 \times 10^{-3}$ Pa (about $1.0 \times 10^{-5}$ Torr) or less) lower than the intermediate vacuum state. Further, an internal pressure of the chamber 11 is controlled by an APC valve (not shown).

A first high frequency power supply 18 is connected to the susceptor 12 within the chamber 11 via a first matching unit 19. The first high frequency power supply 18 applies a high frequency power of a relatively low frequency, e.g., about 2 MHz, for ion attraction to the susceptor 12. In this configuration, the susceptor 12 serves as a lower electrode. Further, the first matching unit 19 reduces reflection of the high frequency power from the susceptor 12. As a result, it is possible to maximize the efficiency of applying the high frequency power to the susceptor 12.

A step-shaped portion is formed in an upper peripheral part of the susceptor 12 such that a central portion of the susceptor 12 protrudes upward in the drawing. An electrostatic chuck 21, made of ceramics, having an electrostatic electrode plate 20 embedded therein is provided on the central portion of the susceptor 12. The electrostatic electrode plate 20 is connected with a DC power supply 22. When a positive DC voltage is applied to the electrostatic electrode plate 20, a negative potential is generated on a surface (hereinafter, referred to as "rear surface") of the wafer W facing the electrostatic chuck 21. As a result, a potential difference is generated between the electrostatic electrode plate 20 and the rear surface of the wafer W. The wafer W is attracted to and held on the electrostatic chuck 21 by a Coulomb force or a Johnsen-Rahbek force generated by the potential difference.

The susceptor 12 includes therein a cooling unit (not shown) formed of a coolant path. The cooling unit absorbs heat of the wafer W, of which a temperature can be increased by being in contact with plasma, via the susceptor 12. Therefore, it is possible to prevent the temperature of the wafer W from being increased higher than a desired level.

The susceptor 12 is made of a conductor such as aluminum in consideration of heat transfer efficiency and a function as an electrode. However, in order to prevent the conductor from being exposed to the processing chamber 15 where the plasma is generated, a side surface of the susceptor 12 is coated with a side surface protection member 23 made of a dielectric material such as quartz ($SiO_2$).

Further, a focus ring 24 is mounted on the step-shaped portion in an upper part of the susceptor 12 and the side surface protection member 23 so as to surround the wafer W held on the electrostatic chuck 21. Furthermore, a shield ring 25 is provided on the side surface protection member 23 so as to surround the focusing ring 24. The focus ring 24 is made of silicon (Si) or silicon carbide (SiC). Further, the plasma is distributed above the wafer and the focus ring 24.

A shower head 26 is provided at a ceiling of the chamber 11 so as to face the susceptor 12. The shower head includes a cooling plate 28 that supports an upper electrode plate 27 in a detachable manner and a cover 29 that covers the cooling plate 28. The upper electrode plate 27 is configured as a circular plate-shaped member having a multiple number of gas holes 30 formed through the upper electrode plate 27 in a thickness direction thereof. A buffer room 31 is formed within the cooling plate 28 and connected to a processing gas inlet line 32.

A second high frequency power supply 33 is connected to the upper electrode plate 27 of the shower head 26 via a second matching unit 34. The second high frequency power supply 33 applies a high frequency power of a relatively high frequency, e.g., about 40 MHz, for plasma generation to the upper electrode plate 27. In this configuration, the shower head 26 serves as an upper electrode. Further, the second matching unit 34 reduces reflection of the high frequency powers from the upper electrode plate 27. As a result, it is possible to maximize the efficiency of applying the high frequency power to the upper electrode plate 27.

The substrate processing apparatus 10 includes a control unit 35. The control unit 35 controls an operation of each component according to a program stored in an internal memory so as to perform a plasma etching process. To be specific, the control unit 35 controls an operation of each component, so that a processing gas supplied to the buffer room 31 from the processing gas inlet line 32 is introduced to the inner space of the processing chamber 15; the introduced processing gas is excited into plasma with the high frequency power for plasma generation applied to the inner space of the processing chamber 15 from the second high frequency power supply 33 via the upper electrode plate 27; ions of the plasma are attracted toward the wafer W with the high frequency power for ion attraction applied to the susceptor 12 from the first high frequency power supply 18; and a plasma etching process is performed to the wafer W.

Figure 2:
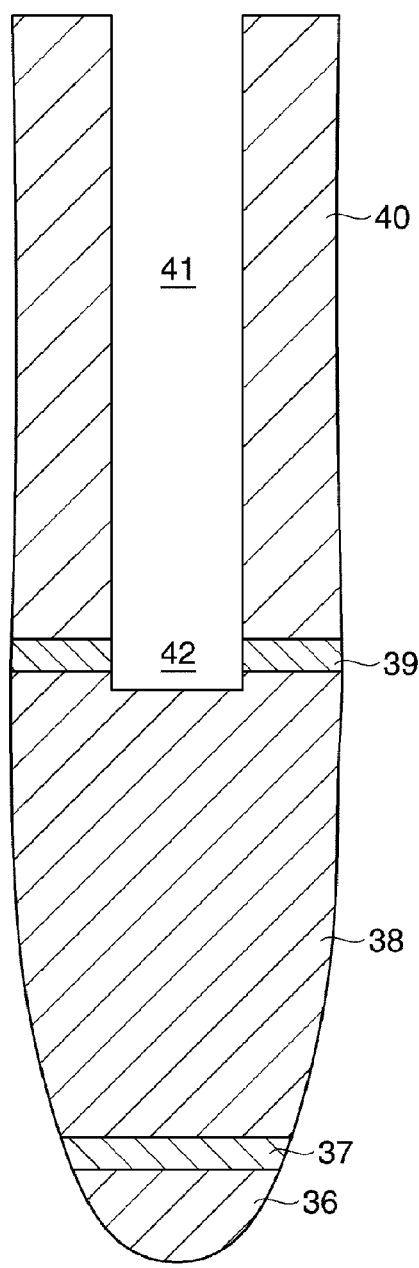
FIG. 2 is a partial cross-sectional view that schematically shows a configuration of a wafer on which a plasma etching process is performed by the substrate processing apparatus of FIG. 1.

FIG. 2 is a partial cross-sectional view that schematically shows a configuration of a wafer on which a plasma etching process is performed by the substrate processing apparatus of FIG. 1.

In FIG. 2, the wafer W includes a support oxide layer 37, a polysilicon layer 38, a support silicon nitride layer 39, and a hard mask layer 40 containing, e.g., a silicon oxide on a silicon base 36 in that order from the bottom. In the present illustrative embodiment, the hard mask layer 40 includes an opening 41 formed by a certain pattern. The support silicon nitride layer 39 includes an opening 42 corresponding to the opening 41. The polysilicon layer 38 is exposed to a bottom area of the opening 42.

Typically, a polysilicon layer is etched by using plasma generated from a processing gas containing hydrogen bromide. In this case, as described above, a bromine radical in the plasma reacts with silicon so as to produce silicon bromide. The generated silicon bromide is deposited on inner surfaces of a hole and a trench formed in the polysilicon layer as deposits. Since it is difficult to remove the silicon bromide with a bromine cation and the bromine radical, the silicon bromide suppresses etching of the polysilicon layer so that an etching rate thereof is decreased.

Thus, the present inventor makes a close study and finds that when the polysilicon layer 38 is etched with plasma generated from a processing gas containing hydrogen bromide, asked with plasma generated from a processing gas containing oxygen, and then etched with plasma generated from a processing gas containing fluorine, a hole and a trench of a high aspect ratio can be formed in the polysilicon layer 38 without decreasing an etching rate. The illustrative embodiments are based on this finding.

Figure 3:
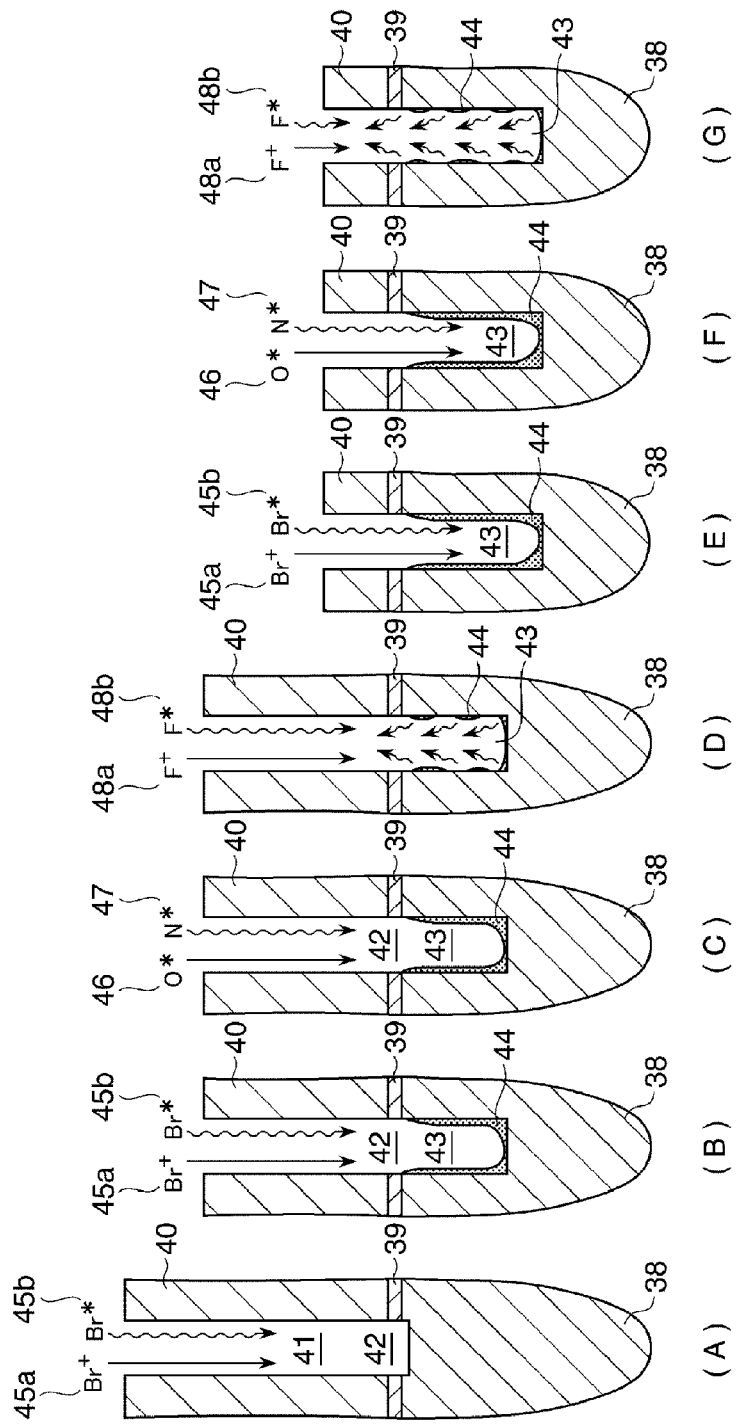
FIG. 3 is a process diagram showing a substrate processing method in accordance with the illustrative embodiment.

FIG. 3 is a process diagram showing a substrate processing method in accordance with the illustrative embodiment.

The polysilicon layer 38 exposed to the bottom area of the opening 42 is etched with plasma generated from a processing gas containing hydrogen bromide in a depressurized environment where an atmosphere does not exist. In this case, a bromine cation 45*a* and a bromine radical 45*b* are generated from the processing gas. The bromine cation 45*a* is attracted to the polysilicon layer 38 by the high frequency power for ion attraction applied to the susceptor 12, and physically etches the polysilicon layer 38 by means of sputtering. The bromine radical 45*b* reacts with silicon of the polysilicon layer 38, and chemically etches the polysilicon layer 38 (FIG. 3(A)).

When the bromine radical 45*b* reacts with the silicon in a depressurized environment where an atmosphere does not exist, silicon bromide is generated. The generated silicon bromide serving as a deposit 44 is deposited on an inner surface of a hole 43 formed in the polysilicon layer 38 by means of etching (FIG. 3(B)).

Then, when the deposit 44 covers the entire inner surface of the hole 43, a processing gas containing oxygen and nitrogen is supplied into the processing chamber 15. The polysilicon layer 38 is asked by using plasma generated from this processing gas. In this case, an oxygen radical and a nitrogen radical 47 are generated from the processing gas, so that an oxidation process is performed on the deposit 44. To be specific, the oxygen radical 46 oxidizes the silicon bromide in the deposit 44, substitutes the bromine with oxygen, and changes the silicon bromide into silicon dioxide ($SiO_2$). The nitrogen radical 47 accelerates oxidation from the silicon bromide to the silicon dioxide. The oxygen radical 46 and the nitrogen radical 47 do not react with silicon, and, thus, they do not etch the polysilicon layer 38, and the hole 43 is not deepened (FIG. 3(C)).

Most of the silicon bromide in the deposit 44 is changed into the silicon dioxide by the oxidation process followed after the asking, and then a processing gas containing fluorine is supplied into the processing chamber 15. The polysilicon layer 38 is etched by using plasma generated from this processing gas. In this case, a fluorine cation 48*a* and a fluorine radical 48*b* are generated from the processing gas. The fluorine cation 48*a* is attracted to the inside of the hole 43 by the high frequency power for ion attraction and physically etches the deposit 44 by means of sputtering. The fluorine radical 48*b* reacts with the silicon dioxide of the deposit 44 and chemically etches the deposit 44 (FIG. 3(D)). The fluorine cation 48*a* and the fluorine radical 48*b* have high reactivity with the silicon dioxide, and the silicon dioxide can be easily removed by means of a physical etching process and a chemical etching process. Thus, most of the deposit 44 is removed from the inside of the hole 43, and the polysilicon layer 38 is exposed again.

Although the fluorine cation 48*a* and the fluorine radical 48*b* may etch silicon as well as the silicon bromide, the entire inner surface of the hole 43 is covered with the deposit 44, and, thus, the polysilicon layer 38 is not etched until the deposit 44 is removed. Therefore, for example, a bowing caused by etching a side surface of the hole 43 is not generated.

Generally, when the high frequency power for ion attraction has a low frequency, a cation is likely to follow a change of the high frequency power. Thus, if a frequency is set to have a low value, for example, equal to or less than about 13.52 MHz, desirably, less than about 3 MHz, more desirably, less than 2 MHz, more fluorine cations 48*a* can be attracted into the hole 43 to thereby remove the deposit 44 within the hole 43. In particular, the fluorine cation 48a can be attracted toward a bottom area of the hole 43. As a result, if an aspect ratio of the hole 43 becomes high, it is desirable to set the frequency of the high frequency power for ion attraction to have a low value.

After the deposit 44 is removed from the inside of the hole 43 and the polysilicon layer 38 is exposed, the processing gas containing bromine is supplied again into the processing chamber 15. The polysilicon layer 38 is etched by using the bromine cation 45a and the bromine radical 45b generated from this processing gas. In this case, silicon bromide is generated and deposited on the inner surface of the hole 43 as the deposit 44 (FIG. 3(E)).

Thereafter, in the same manner as depicted in FIG. 3(C), the processing gas containing oxygen and nitrogen is supplied into the processing chamber 15. The deposit 44 is oxidized by using the oxygen radical 46 generated from this processing gas. The silicon bromide in the deposit 44 is oxidized and changed into a silicon dioxide. The nitrogen radical 47 accelerates oxidation from the silicon bromide to the silicon dioxide (FIG. 3(F)).

Then, in the same manner as depicted in FIG. 3(D), the processing gas containing fluorine is supplied into the processing chamber 15. The deposit 44 as the silicon dioxide is etched and removed by using the fluorine cation 48a and the fluorine radical 48b generated from this processing gas (FIG. 3(G)).

In the substrate processing method in accordance with the present illustrative embodiment, the processes depicted in FIGS. 3(E) to 3(G) are repeated until the hole 43 has a depth as required.

Figure 4:
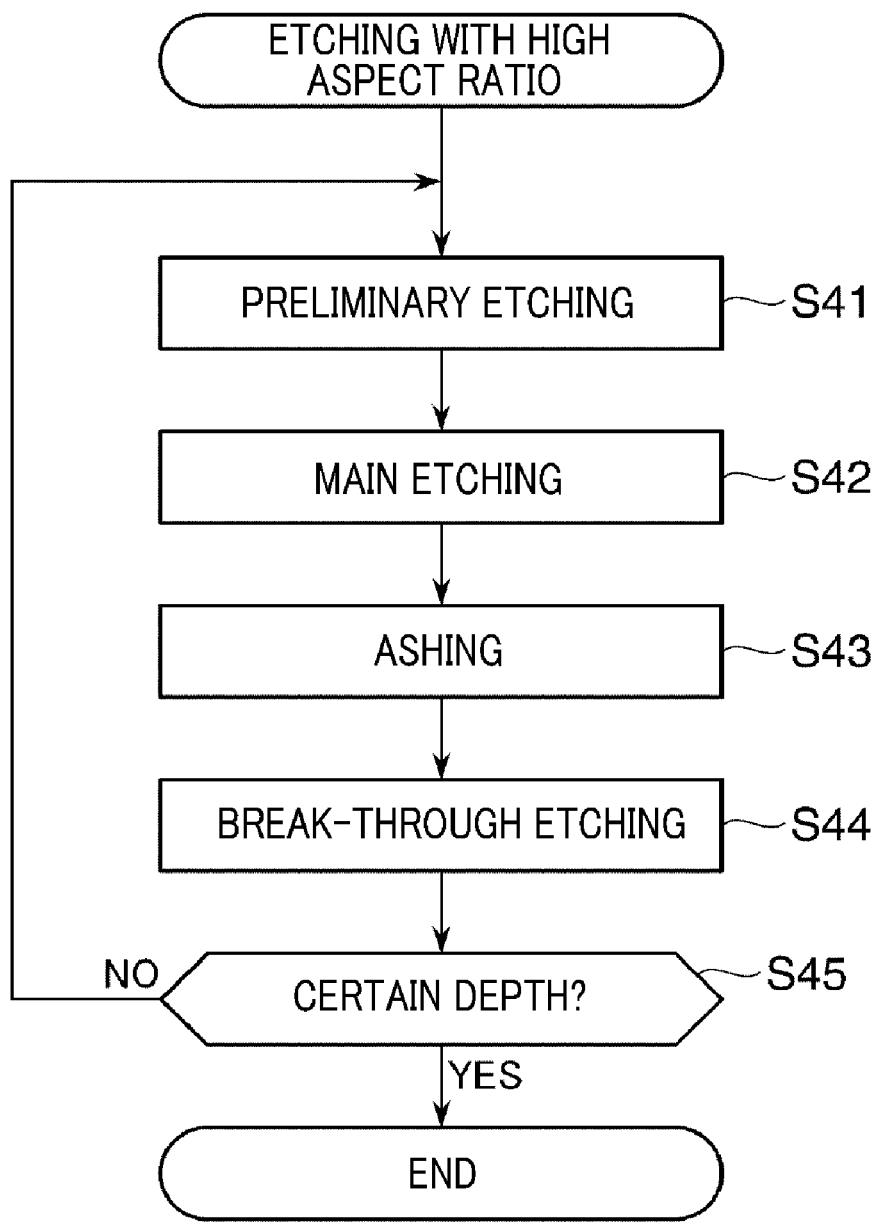
FIG. 4 is a flowchart showing an etching process with a high aspect ratio as a substrate processing method in accordance with the illustrative embodiment.
Figure 5:
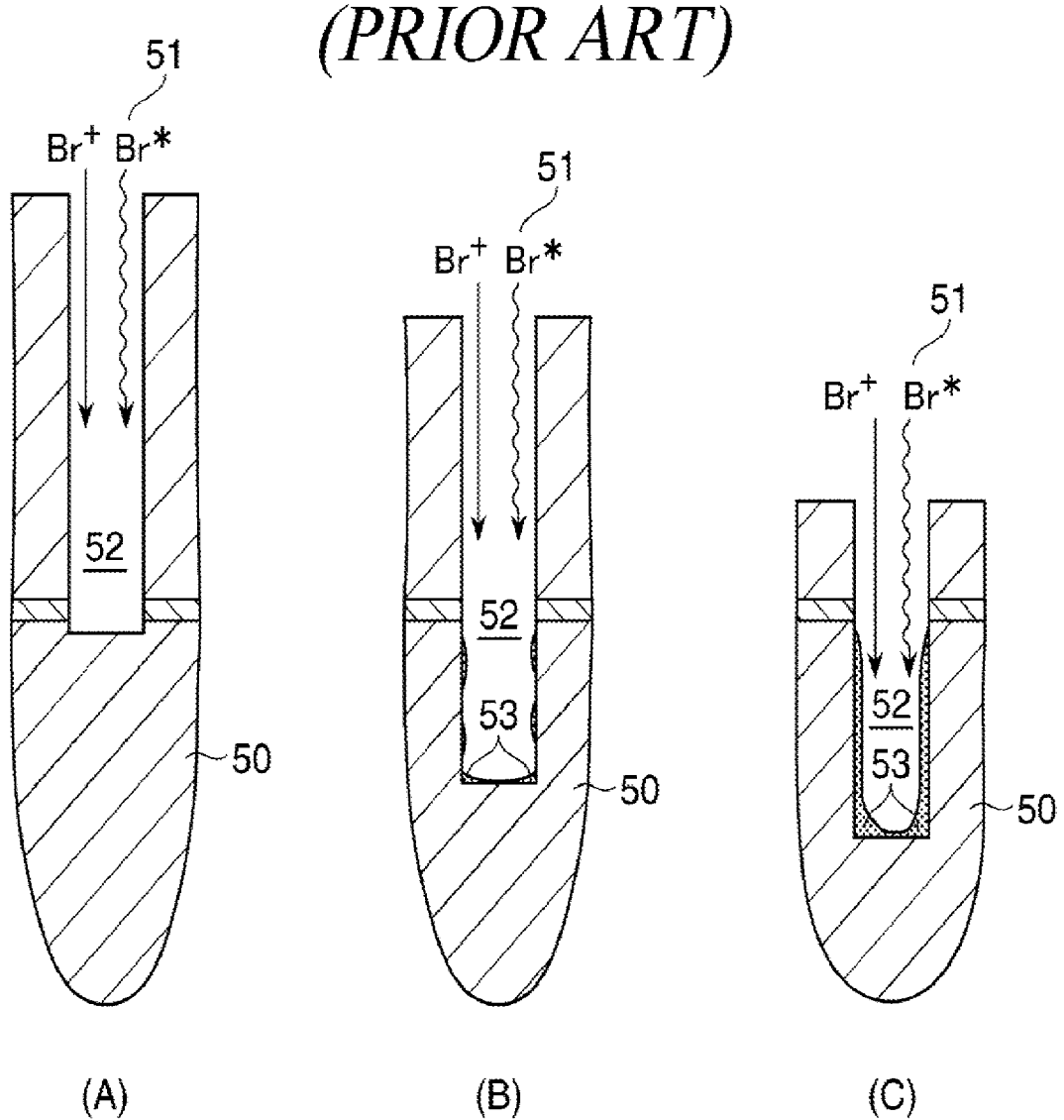
FIG. 5 is a process diagram showing a conventional substrate processing method.

FIG. 4 is a flowchart showing an etching process with a high aspect ratio as the substrate processing method in accordance with the present illustrative embodiment.

In FIG. 4, a processing gas containing a hydrogen bromide gas (HBr), an oxygen gas ($O_2$), and a nitrogen trifluoride gas ($NF_3$) is supplied into the processing chamber 15. The high frequency power for plasma generation in a range of from about 600 W to about 800 W, desirably, about 700 W is applied to the upper electrode plate 27. The high frequency power for ion attraction in a range of from about 200 W to about 400 W, desirably, about 300 W is applied to the susceptor 12. An internal pressure of the processing chamber 15 is set to be in a range of from about mTorr to about 50 mTorr, desirably, about 40 mTorr. Under this condition, plasma is generated from the processing gas. An etching process using the plasma is performed for about 9 seconds to about 11 seconds, desirably, about 10 seconds as a preliminary etching process (step S41).

In the preliminary etching process, the hydrogen bromide gas has a flow rate in a range of from about 3 sccm to about 7 sccm, desirably, about 5 sccm, the oxygen gas has a flow rate in a range of from about 120 sccm to about 140 sccm, desirably, about 130 sccm, and the nitrogen trifluoride gas has a flow rate in a range of from about 3 sccm to about 7 sccm, desirably, about 5 sccm.

In this case, the fluorine cation 48a and the fluorine radical 48b generated from the processing gas etch and remove a native oxide film (not shown), including silicon dioxide, on the surface of the polysilicon layer 38 exposed at the opening 42. The bromine cation 45a and the bromine radical 45b generated from the processing gas first etch and remove an irregular-shaped portion, for example, a protrusion on the exposed surface of the polysilicon layer 38. As a result, the surface of the polysilicon layer 38 can be trimmed.

Then, the processing gas containing the hydrogen bromide gas, the oxygen gas, and the nitrogen trifluoride gas is supplied into the processing chamber 15. The high frequency power for plasma generation in a range of from about 400 W to about 600 W, desirably, about 500 W is applied to the upper electrode plate 27. The high frequency power for ion attraction in a range of from about 1400 W to about 1600 W, desirably, about 1500 W is applied to the susceptor 12. The internal pressure of the processing chamber 15 is set to be in a range of from about 90 mTorr to about 110 mTorr, desirably, about 100 mTorr. Under this condition, plasma is generated from the processing gas. An etching process using the plasma is performed for about 84 seconds to about 96 seconds, desirably, about 90 seconds as a main etching process (step S42).

In the main etching process, the hydrogen bromide gas has a flow rate in a range of from about 8 sccm to about 12 sccm, desirably, about 10 sccm, the oxygen gas has a flow rate in a range of from about 220 sccm to about 230 sccm, desirably, about 225 sccm, and the nitrogen trifluoride gas has a flow rate in a range of from about 18 sccm to about 22 sccm, desirably, about 20 sccm.

In this case, the bromine cation 45a and the bromine radical 45b generated from the processing gas etch the polysilicon layer 38 having the trimmed surface, so that the hole 43 is formed in the polysilicon layer 38. Here, silicon bromide is generated and deposited as the deposit 44 on the inner surface of the hole 43. The deposit 44 covers the entire inner surface of the hole 43.

Then, a processing gas containing an oxygen gas and a nitrogen gas is supplied into the processing chamber 15. The high frequency power for plasma generation in a range of from about 400 W to about 600 W, desirably, about 500 W is applied to the upper electrode plate 27. The high frequency power for ion attraction in a range of from about 1400 W to about 1600 W, desirably, about 1500 W is applied to the susceptor 12. The internal pressure of the processing chamber 15 is set to be in a range of from about 90 mTorr to about 110 mTorr, desirably, about 100 mTorr. Under this condition, plasma is generated from the processing gas and an ashing process using the plasma is performed for about 2 seconds to about 4 seconds, desirably, about 3 seconds (step S43).

In the ashing process, the oxygen gas has a flow rate in a range of from about 95 sccm to about 105 sccm, desirably, about 100 sccm and the nitrogen gas has a flow rate in a range of from about 150 sccm to about 160 sccm, desirably, about 155 sccm.

In this case, the oxygen radical 46 generated from the processing gas oxidizes the silicon bromide in the deposit 44, so that the silicon bromide is changed into silicon dioxide.

Thereafter, a processing gas containing an argon gas (Ar) and a nitrogen trifluoride gas is supplied into the processing chamber 15. The high frequency power for plasma generation in a range of from about 400 W to about 600 W, desirably, about 500 W is applied to the upper electrode plate 27. The high frequency power for ion attraction in a range of from about 1400 W to about 1600 W, desirably, about 1500 W is applied to the susceptor 12. The internal pressure of the processing chamber 15 is set to be in a range of from about 90 mTorr to about 110 mTorr, desirably, about 100 mTorr. Under this condition, plasma is generated from the processing gas and an etching process using the plasma is performed for about 4 seconds to about 6 seconds, desirably, about 5 seconds as a break-through etching process (step S44).

In the break-through etching process, the argon gas has a flow rate in a range of from about 150 sccm to about 160 sccm, desirably, about 155 sccm, and the nitrogen trifluoride gas has a flow rate in a range of from about 95 sccm to about 105 sccm, desirably, about 100 sccm.

In this case, the fluorine cation 48a and the fluorine radical 48b generated from the processing gas etch and remove the deposit 44 including the silicon dioxide. As a result, the polysilicon layer 38 is exposed again within the hole 43.

Then, it is determined whether or not the hole 43 has a certain depth. If the hole 43 does not have the certain depth, the process returns to step S41. If the hole 43 has the certain depth, the process is finished.

In the substrate processing method in accordance with the present illustrative embodiment, the polysilicon layer 38 on the wafer W is etched with the bromine cation 45a and the bromine radical 45b of the plasma generated from the processing gas containing the hydrogen bromide gas, the oxygen gas, and the nitrogen trifluoride gas. Then, the polysilicon layer 38 is ashed with the oxygen radical 46 and the nitrogen radical 47 of the plasma generated from the processing gas containing the oxygen gas and the nitrogen gas. Thereafter, the polysilicon layer 38 is etched with the fluorine cation 48a and the fluorine radical 48b of the plasma generated from the processing gas containing the argon gas and the nitrogen trifluoride gas. While the polysilicon layer 38 is ashed, the oxidation process is performed on the silicon bromide generated by etching the polysilicon layer 38 with bromine plasma (the bromine cation 45a and the bromine radical 45b). The silicon bromide generated by etching the polysilicon layer 38 is generally difficult to be etched and removed with the bromine plasma. However, the silicon bromide is oxidized with the oxygen radical 46 generated during the ashing process and changed into silicon dioxide. As a result, the silicon dioxide can be easily etched and removed by means of etching with the fluorine cation 48a and the fluorine radical 48b. That is, the silicon bromide is changed into the silicon dioxide, and can be easily removed. Therefore, it is possible to remove the deposit 44 formed of the silicon bromide deposited on the inner surface of the hole 43. As a result, the hole 43 of a high aspect ratio can be formed in the polysilicon layer 38 without decreasing an etching rate.

In the substrate processing method in accordance with the present illustrative embodiment, the main etching process, the ashing process, and the break-through etching process are repeatedly performed in this sequence. Thus, the silicon bromide generated during the main etching process is removed whenever it is generated. That is, while the hole 43 is formed, the deposit 44 is hardly deposited to the inner surface of the hole 43. Therefore, the etching rate is not decreased.

Further, in the substrate processing method in accordance with the present illustrative embodiment, prior to the main etching process, the polysilicon layer 38 is preliminarily etched with the plasma generated from the processing gas containing the hydrogen bromide gas and the nitrogen trifluoride gas. Thus, the native oxide film formed of the silicon dioxide on the surface of the polysilicon layer 38 can be removed, and further, the irregular-shaped portion on the polysilicon layer 38 can be removed. As a result, the surface of the polysilicon layer 38 can be trimmed and the hole 43 can be formed effectively.

In the substrate processing method in accordance with the present illustrative embodiment, as found by the present inventor through experiments, the processing time of the main etching process corresponds to a time required for the deposit 44 to cover the entire inner surface of the hole 43, the processing time of the ashing process corresponds to a time required for most of the silicon bromide in the deposit to be changed into the silicon dioxide, and the processing time of the break-through etching process corresponds to a time required for the deposit 44 to be removed from the inside of the hole 43. Therefore, if a processing time ration between main etching process, the ashing process, and the break-through etching process is set to be from about 42 to about 48: from about 1 to about 2: from about 2 to about 3, it is possible to etch the silicon, change the silicon bromide, and remove the silicon dioxide in a balanced way. Thus, the hole 43 can be formed efficiently.

In the substrate processing method in accordance with the present illustrative embodiment, in each of the main etching process, the ashing process, and the break-through etching process, the internal pressure of the processing chamber 15 is set to be in the range of from about 90 mTorr to about 110 mTorr, desirably, about 100 mTorr. Therefore, the internal pressure of the processing chamber 15 can be set uniformly in the main etching process, the ashing process, and the break-through etching process. Thus, it is not necessary to change the internal pressure of the processing chamber 15 for each process and the hole 43 can be formed efficiently.

Further, in accordance with the substrate processing method of the present illustrative embodiment, in each of the main etching process, the ashing process, and the break-through etching process, an output value of the high frequency power for plasma generation is set to be in a range of from about 400 W to about 600 W, desirably, about 500 W, and an output value of the high frequency power for ion attraction is set to be in a range of from about 1400 W to about 1600 W, desirably, about 1500 W. Therefore, the output values of the high frequency powers for plasma generation and ion attraction can be set uniformly in the main etching process, the ashing process, and the break-through etching process. Thus, it is not necessary to change the output values of the high frequency powers for each process, and the hole 43 can be formed efficiently.

Furthermore, in accordance with the substrate processing method of the present illustrative embodiment, a total flow rate of the processing gas is set to be a range of from about 246 sccm to about 264 sccm in the main etching process, a total flow rate of the processing gas is set to be in a range of from about 245 sccm to about 265 sccm in the ashing process, and a total flow rate of the processing gas is set to be in a range of from about 245 sccm to about 265 sccm in the break-through etching process. Therefore, the total flow rate of the processing gas can be set uniformly in the main etching process, the ashing process, and the break-through etching process. Thus, it is not necessary to change the total flow rate of the processing gas for each process, and the hole 43 can be formed efficiently.

Although the illustrative embodiment is provided above, the present disclosure is not limited thereto. By way of example, the hole 43 is formed in the polysilicon layer 38, but the present disclosure can be applied to a case where a trench is formed in the polysilicon layer 38.

The objects of the present disclosure can be achieved by supplying a storage medium storing a software program for implementing the function of the aforementioned embodiment to a computer or the like, and by causing a CPU of the computer to read out and execute the program stored in the storage medium.

In such a case, the program itself read out from the storage medium may implement the functions of the aforementioned embodiment, and the present disclosure may be embodied by the program and the storage medium storing the program.

If a storage medium for supplying a program can store the above-described program, the storage medium may include, for example, a RAM, a NV-RAM, a floppy (registered trademark) disk, a hard disk, a magneto-optical dick, an optical disk such as a CD-ROM, a CD-R, a CD-RW, a DVD (DVD-ROM, DVD-RAM, DVD-RW, DVD+RW), a magnetic tape, a nonvolatile memory card, and other ROMs. Alternatively, the program may be supplied into the computer by downloading it from another computer or database, or a computer (not shown) connected to the Internet, a commercial network, a local area network (LAN) or the like.

Further, the function of each embodiment described above can be implemented by executing the program read by the CPU of the computer, and an OS (operating system) operated on the CPU may perform a part or all of the actual process in response to instructions of the program and the function of each embodiment may be implemented by the process.

Further, the program read from the storage medium may be written in a memory of a function extension board inserted into the computer or a function extension unit connected to the computer, and a CPU of the function extension board or the function extension unit may perform a part or all of the actual process in response to instructions of the program, and the function of each embodiment may be implemented by the process.

The program may include an object code, a program executable by an interpreter, script data supplied to an OS, or the like.

What is claimed is:

1. A substrate processing method performed in a substrate processing apparatus including a processing chamber that accommodates therein a wafer, the substrate processing method comprising:
   a main etching process for etching a silicon layer formed on the wafer with plasma generated from a processing gas containing bromine to form a hole within the silicon layer;
   an ashing process for ashing the etched silicon layer with plasma generated from a processing gas containing oxygen; and
   a break-through etching process for etching the ashed silicon layer with plasma generated from a processing gas containing fluorine,
   wherein
   in the main etching process, silicon bromide is generated and deposited on an inner surface of the hole, so that the silicon bromide covers an entire inner surface of the hole,
   in the ashing process, an oxygen radical generated from the processing gas containing oxygen oxidizes the silicon bromide, so that the silicon bromide is changed into a silicon dioxide, and
   in the break-through etching process, a fluorine cation and a fluorine radical generated from the processing gas containing fluorine etch and remove the silicon dioxide.

2. The substrate processing method of claim 1, wherein the main etching process, the ashing process, and the break-through etching process are performed in this sequence and repeated twice or more.

3. The substrate processing method of claim 1, further comprising:
   prior to the main etching process, a preliminary etching process for etching the silicon layer with the plasma generated from the processing gas containing bromine and the processing gas containing fluorine.

4. The substrate processing method of claim 1, wherein the processing gas containing oxygen contains a nitrogen gas.

5. The substrate processing method of claim 1, wherein a processing time ratio between the main etching process, the ashing process, and the break-through etching process is from about 42 to about 48: from about 1 to about 2: from about 2 to about 3.

6. The substrate processing method of claim 1, wherein in the break-through etching process, two electric powers having a higher frequency and a lower frequency are used in the substrate processing apparatus, the lower frequency is less than about 13.52 MHz.

7. The substrate processing method of claim 6, wherein the lower frequency is less than about 3 MHz.

8. The substrate processing method of claim 1, wherein an internal pressure of the processing chamber is controlled to be substantially constant during the main etching process, the ashing process, and the break-through etching process.

9. The substrate processing method of claim 1, wherein each of output values of two high frequency powers used in the substrate processing apparatus is controlled to be substantially constant during the main etching process, the ashing process, and the break-through etching process.

10. The substrate processing method of claim 1, wherein a total flow rate of each of the processing gases supplied to the processing chamber is controlled to be substantially constant during the main etching process, the ashing process, and the break-through etching process.

* * * * *

UNITED STATES PATENT AND TRADEMARK OFFICE
CERTIFICATE OF CORRECTION

PATENT NO. : 8,778,206 B2  
APPLICATION NO. : 13/400247  
DATED : July 15, 2014  
INVENTOR(S) : Nishimura et al.

Page 1 of 1

It is certified that error appears in the above-identified patent and that said Letters Patent is hereby corrected as shown below:

In the specification,

Column 6, line 25, please replace "asked" with - ashed -

Column 6, line 26, please add - 46 - between "radical" and "and"

Column 6, line 39, please replace "asking" with - ashing -

Column 7, line 46, please add - 30 - between "about" and "mTorr"

Column 9, line 65, please add - 44 - between "deposit" and "to"

Signed and Sealed this  
Twenty-second Day of December, 2015

Michelle K. Lee  
*Director of the United States Patent and Trademark Office*